United States Patent
Nagamatsu et al.

(10) Patent No.: US 10,297,516 B2
(45) Date of Patent: May 21, 2019

(54) SEMICONDUCTOR DEVICE

(71) Applicant: Panasonic Intellectual Property Management Co., Ltd., Osaka (JP)

(72) Inventors: Masayuki Nagamatsu, Osaka (JP); Shinya Marumo, Osaka (JP); Junichi Kimura, Osaka (JP); Tatsuya Kunisato, Osaka (JP); Ryosuke Usui, Hokkaido (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/746,013

(22) PCT Filed: Mar. 1, 2017

(86) PCT No.: PCT/JP2017/008069
§ 371 (c)(1),
(2) Date: Jan. 19, 2018

(87) PCT Pub. No.: WO2017/169485
PCT Pub. Date: Oct. 5, 2017

(65) Prior Publication Data
US 2018/0197802 A1    Jul. 12, 2018

(30) Foreign Application Priority Data

Mar. 30, 2016 (JP) ................. 2016-067197

(51) Int. Cl.
*H01L 23/12* (2006.01)
*H01L 23/28* (2006.01)
(Continued)

(52) U.S. Cl.
CPC .............. *H01L 23/12* (2013.01); *H01L 23/28* (2013.01); *H01L 23/3142* (2013.01);
(Continued)

(58) Field of Classification Search
CPC ................................. H01L 23/28; H01L 23/48
See application file for complete search history.

(56) References Cited

U.S. PATENT DOCUMENTS 6,097,054 A * 8/2000 Manabe ............ H01L 27/10844
257/309
6,304,001 B1 * 10/2001 Sekiguchi ............. H01L 23/544
257/734
(Continued)

FOREIGN PATENT DOCUMENTS

JP    6-265924 A    9/1994
JP    10-294024 A   11/1998
(Continued)

OTHER PUBLICATIONS

International Search Report of PCT application No. PCT/JP2017/008069 dated May 9, 2017.

*Primary Examiner* — Caridad Everhart
*Assistant Examiner* — Ankush K Singal
(74) *Attorney, Agent, or Firm* — McDermott Will & Emery LLP

(57) ABSTRACT

A semiconductor device includes a semiconductor element, a base, and an outer packaging resin. The base has a mounting surface, on which the semiconductor element is mounted, and a groove provided around the semiconductor element on the mounting surface. An outer packaging resin covers the semiconductor element and the base, and is fixed to the base by filling the groove. A bottom of the groove includes a first recess-projection having a first amplitude and a first repetition interval along an extending direction of the groove. The first recess-projection includes a second recess-projection having a second amplitude smaller than the first amplitude and a second repetition interval shorter than the first repetition interval along the extending direction of the groove.

7 Claims, 11 Drawing Sheets

(51) Int. Cl.
*H01L 23/48* (2006.01)
*H01L 23/50* (2006.01)
*H01L 23/31* (2006.01)
*H01L 23/495* (2006.01)

(52) U.S. Cl.
CPC ........ *H01L 23/48* (2013.01); *H01L 23/49503* (2013.01); *H01L 23/49548* (2013.01); *H01L 23/50* (2013.01); *H01L 23/3107* (2013.01)

(56) References Cited

U.S. PATENT DOCUMENTS

| | | | |
|---|---|---|---|
| 9,105,749 B2* | 8/2015 | Sasagawa | H01L 21/8252 |
| 9,478,509 B2* | 10/2016 | Filippi | H01L 24/05 |
| 2004/0108513 A1* | 6/2004 | Narukawa | H01L 33/24 |
| | | | 257/103 |
| 2005/0032287 A1* | 2/2005 | Nakazawa | H01L 29/66727 |
| | | | 438/197 |
| 2008/0081161 A1* | 4/2008 | Tomita | H01L 23/145 |
| | | | 428/209 |
| 2008/0265427 A1* | 10/2008 | Hirler | H01L 29/7813 |
| | | | 257/773 |
| 2015/0187671 A1 | 7/2015 | Fukuda et al. | |
| 2016/0260829 A1* | 9/2016 | Aichinger | H01L 27/0629 |
| 2016/0315054 A1 | 10/2016 | Kajihara et al. | |
| 2016/0315184 A1* | 10/2016 | Ishimaru | H01L 24/01 |

FOREIGN PATENT DOCUMENTS

| | | |
|---|---|---|
| JP | 2007-258587 | 10/2007 |
| JP | 2012-255513 A | 12/2012 |
| WO | 2014/098004 | 6/2014 |
| WO | 2015/151273 | 10/2015 |

\* cited by examiner

SEMICONDUCTOR DEVICE

This application is a U.S. national stage application of the PCT International Application No. PCT/JP2017/008069 filed on Mar. 1, 2017, which claims the benefit of foreign priority of Japanese patent application 2016-067197 filed on Mar. 30, 2016, the contents all of which are incorporated herein by reference.

TECHNICAL FIELD

The present invention relates to a semiconductor device used for various electronic devices.

BACKGROUND ART

A conventional semiconductor device will be described below with reference to the accompanying drawing. FIG. 11 is a sectional view illustrating a configuration of conventional semiconductor device 1. In semiconductor device 1, semiconductor element 2 is mounted on lead frame 3, and outer packaging resin 4 covers semiconductor element 2 and lead frame 3. Further, groove 5 is provided on a mounting surface of lead frame 3, on which semiconductor device 1 is mounted. When a part of outer packaging resin 4 enters groove 5, outer packaging resin 4 and groove 5 are fixed to each other. This secures a mutually correct positional relation among outer packaging resin 4, semiconductor element 2, and lead frame 3.

It should be noted that, for example, PTL 1 is known as a prior art document containing information related to the invention in this application.

CITATION LIST

Patent Literature

PTL 1: Unexamined Japanese Patent Publication No. 2007-258587

SUMMARY OF THE INVENTION

In conventional semiconductor device 1, a contact area between outer packaging resin 4 and groove 5 is increased to firmly fix outer packaging resin 4 and lead frame 3 to each other. In other words, a plurality of grooves 5 or hook-shaped grooves 5 is provided on the mounting surface of lead frame 3. As a result, grooves 5 occupy a large area of the mounting surface of lead frame 3, thereby making it difficult to miniaturize semiconductor device 1. Alternatively, groove 5 has the complicated shape, thereby deteriorating productivity of lead frame 3.

Therefore, an object of the present invention is to provide a semiconductor device capable of firmly fixing an outer packaging resin and a base (a lead frame) by a groove, while realizing miniaturization and high productivity.

Also, in order to attain this object, a semiconductor device according to the present invention includes a semiconductor element, a base, and an outer packaging resin. The base has a mounting surface, on which the semiconductor element is mounted, and a groove provided around the semiconductor element on the mounting surface. The outer packaging resin covers the semiconductor element and the base, and is fixed to the base by filling the groove. A bottom of the groove includes a first recess-projection having a first amplitude and a first repetition interval along an extending direction of the groove. The first recess-projection includes a second recess-projection having a second amplitude smaller than the first amplitude and a second repetition interval shorter than the first repetition interval along the extending direction of the groove.

According to the present invention, since the groove of the base includes the first recess-projection and the second recess-projection, a contact area between the outer packaging resin and the groove becomes large, and a shape of a contact surface between the outer packaging resin and the groove becomes complicated. This increases an anchor effect between the outer packaging resin and the groove. Therefore, a fixed state between the outer packaging resin and the base in the semiconductor device can be strengthened, while miniaturization and high productivity are realized. As a result, reliability of a sealed state by the outer packaging resin of the semiconductor device is improved.

DESCRIPTION OF EMBODIMENT

An exemplary embodiment of the present invention will be described below with reference to the accompanying drawings.

(Exemplary Embodiment)

Figure 1:
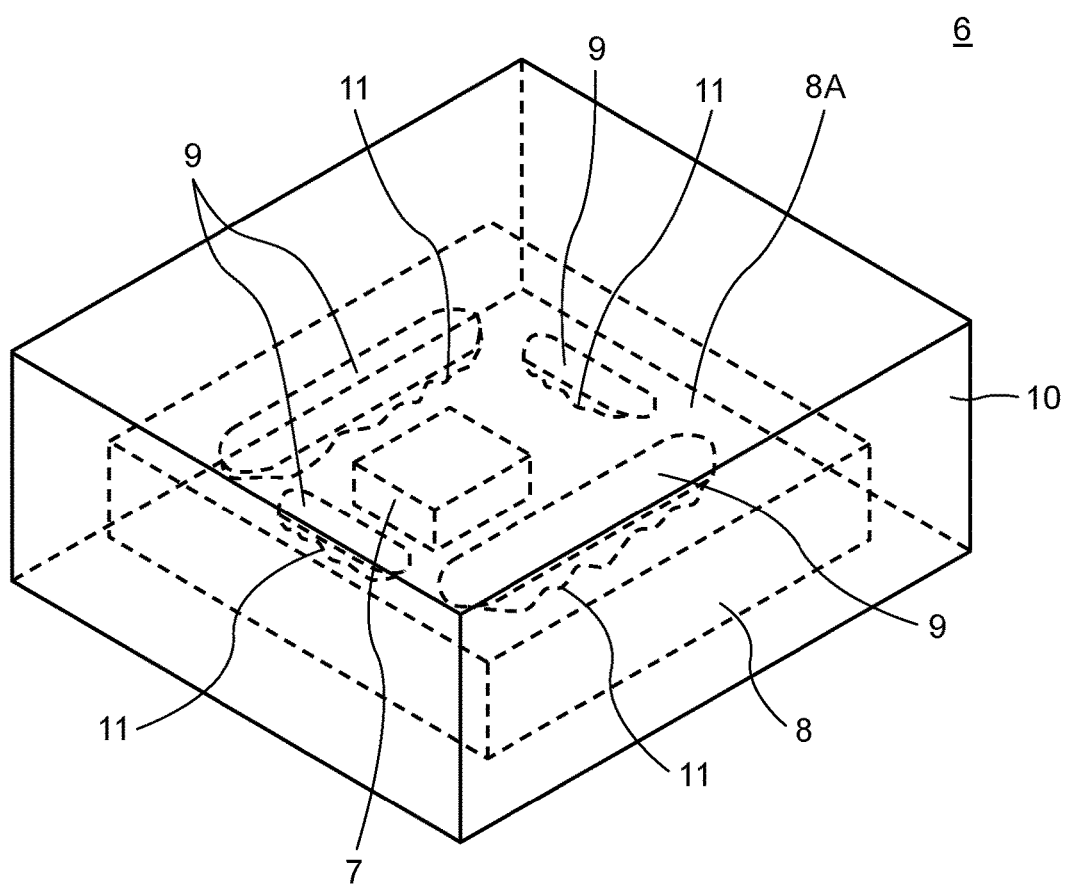
FIG. 1 is a perspective view illustrating a configuration of a semiconductor device according to an exemplary embodiment of the present invention.
Figure 2:
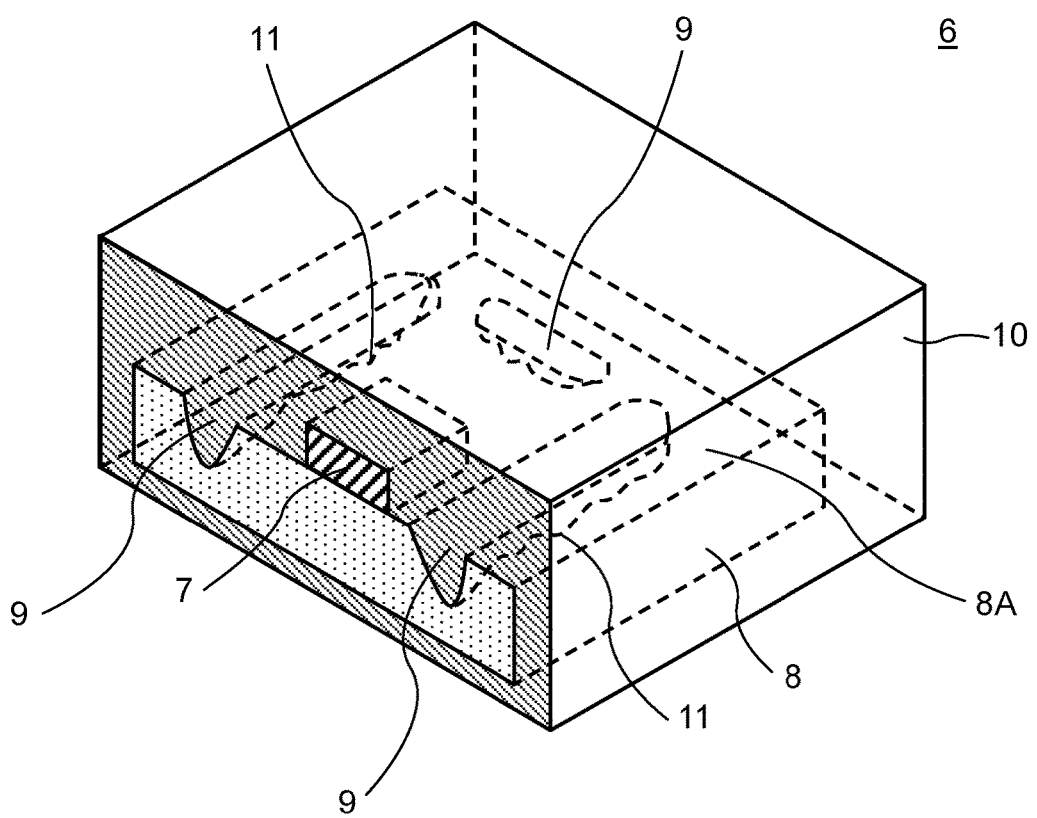
FIG. 2 is a perspective view illustrating a configuration of the semiconductor device according to the exemplary embodiment of the present invention, in which a part of a cross section is exposed.

FIG. 1 is a perspective view illustrating a configuration of semiconductor device 6 according to an exemplary embodiment of the present invention. FIG. 2 is a perspective view illustrating a configuration of semiconductor device 6 according to the exemplary embodiment of the present invention, in which a part of a cross section is exposed.

Semiconductor device 6 includes semiconductor element 7, base 8 made of metal, and outer packaging resin 10.

Base 8 has mounting surface 8A, on which semiconductor element 7 is mounted. Further, base 8 has groove 9 provided around semiconductor element 7 on mounting surface 8A. Outer packaging resin 10 covers semiconductor element 7 and base 8, and is fixed to base 8 by further filling groove 9.

Bottom 11 of groove 9 includes first recess-projection 12 (see FIG. 4) having a first amplitude and a first repetition interval along an extending direction of groove 9. First recess-projection 12 includes second recess-projection 13 (see FIG. 4) having a second amplitude smaller than the first amplitude and a second repetition interval shorter than the first repetition interval along the extending direction of groove 9.

Because of the above-described configuration, a depth of groove 9 on base 8 is not constant along the extending direction of groove 9. Accordingly, a contact area between outer packaging resin 10 and groove 9 becomes large, and a shape of a contact surface between outer packaging resin 10 and groove 9 becomes complicated. This increases an anchor effect between outer packaging resin 10 and groove 9. Therefore, a fixed state between outer packaging resin 10 and base 8 in semiconductor device 6 can be strengthened. As a result, reliability of a sealed state by outer packaging resin 10 of semiconductor device 6 is improved.

In the present exemplary embodiment, a plurality of grooves 9 is provided herein so as to surround semiconductor element 7. However, the present disclosure is not limited to this. The plurality of grooves 9 may not be disposed on all four sides around semiconductor element 7. Grooves 9 may be disposed only on two or three sides around semiconductor element 7. Further, in the present exemplary embodiment, base 8 has the plurality of grooves 9. However, the present disclosure is not limited to this. Base 8 may have only one groove 9. However, since groove 9 is provided around semiconductor element 7, groove 9 does not occupy a large area of mounting surface 8A of base 8.

Figure 3:
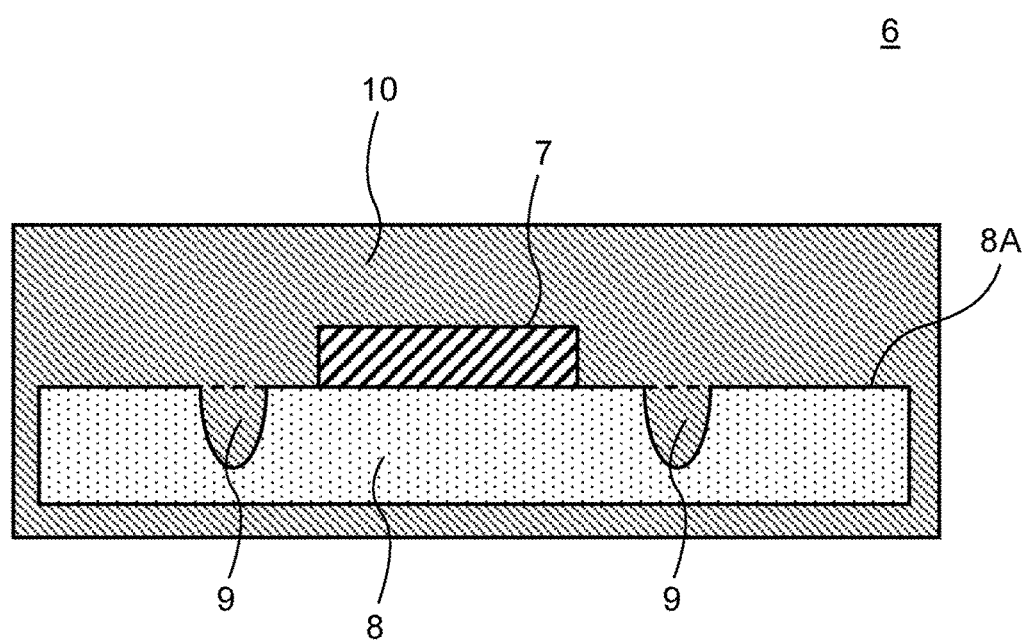
FIG. 3 is a sectional view illustrating a configuration of the semiconductor device according to the exemplary embodiment of the present invention.

A configuration of semiconductor device 6 will be described in more detail below. FIG. 3 is a sectional view illustrating the configuration of semiconductor device 6 according to the exemplary embodiment of the present invention. Base 8 is provided with groove 9. Groove 9 is depressed from mounting surface 8A toward a surface opposite to mounting surface 8A of base 8. A sectional shape of groove 9 is formed in a V shape or a U shape. Groove 9 is filled with a part of outer packaging resin 10.

Figure 4:
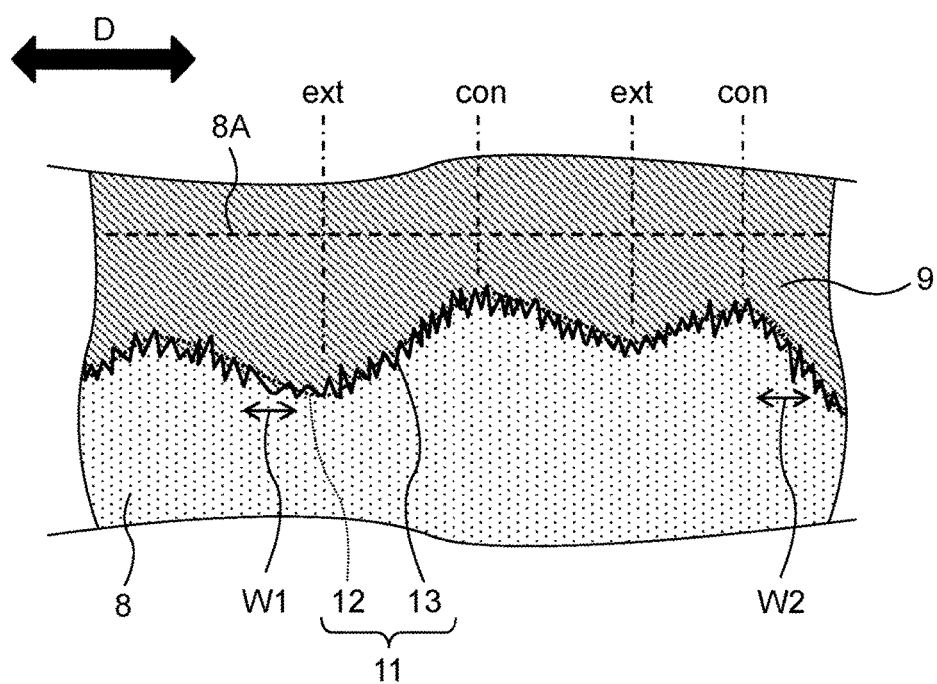
FIG. 4 is a sectional view illustrating a main part of the semiconductor device according to the exemplary embodiment of the present invention.
Figure 5:
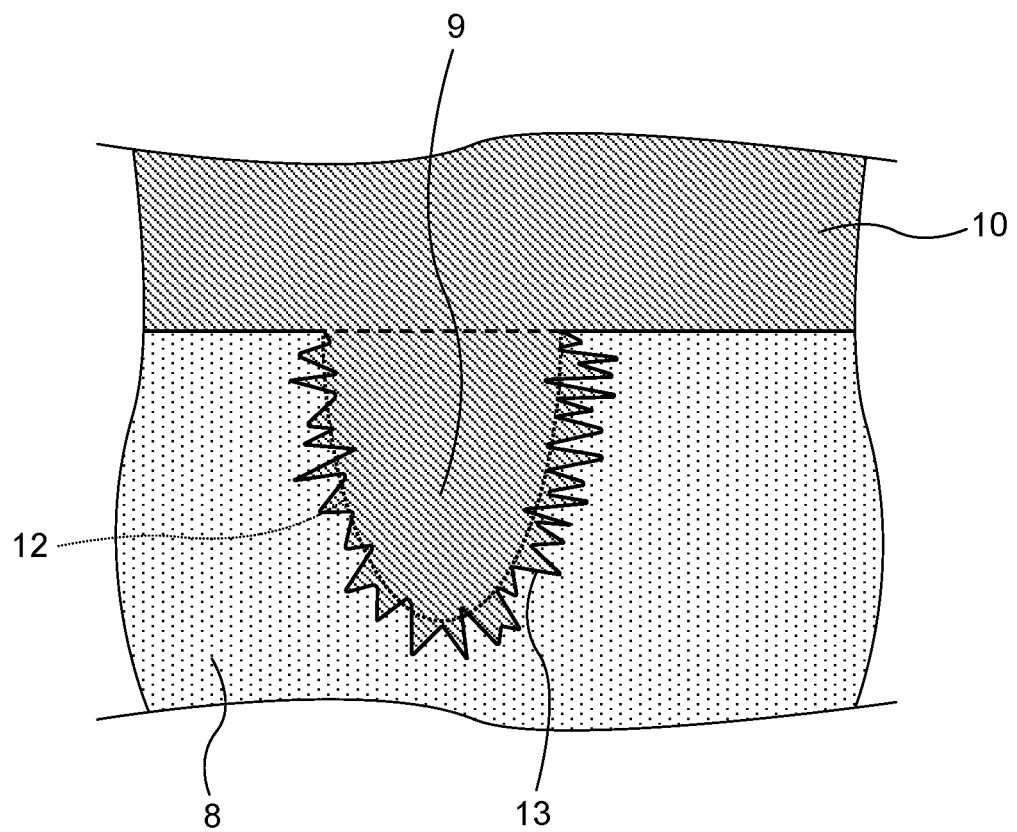
FIG. 5 is a sectional view illustrating another main part of the semiconductor device according to the exemplary embodiment of the present invention.

FIG. 4 is a sectional view illustrating a main part of semiconductor device 6 according to the exemplary embodiment of the present invention. FIG. 5 is a sectional view illustrating another main part of semiconductor device 6 according to the exemplary embodiment of the present invention. FIG. 4 illustrates a cross section along a direction in which groove 9 extends. FIG. 5 illustrates a cross section perpendicular to the direction in which groove 9 extends. In FIG. 4, arrow D indicates the direction in which groove 9 extends.

As illustrated in FIG. 4, bottom 11 of groove 9 includes first recess-projection 12 shown by a dotted line. First recess-projection 12 has a first amplitude and a first repetition interval. Further, first recess-projection 12 includes second recess-projection 13 shown by a solid line. Second recess-projection 13 has a second amplitude and a second repetition interval. Herein, the second amplitude is smaller than the first amplitude, and the second repetition interval is shorter the first repetition interval. In other words, second recess-projection 13 having small waves is superimposed on first recess-projection 12 having large waves. It should be noted that a surface of first recess-projection 12 is a virtual surface as shown by the dotted line.

First recess-projection 12 and second recess-projection 13 each have the amplitude and the repetition interval. Herein, the amplitudes and the repetition intervals of first recess-projection 12 and second recess-projection 13 do not have fixed values or regularity, and fluctuate randomly. For example, second recess-projection 13 corresponding to width W1 has a comparatively long repetition interval and a comparatively small amplitude. On the other hand, second recess-projection 13 corresponding to width W2 has a comparatively short repetition interval and a comparatively large amplitude. In this way, first recess-projection 12 may have both second recess-projection 13 corresponding to width W1 and second recess-projection 13 corresponding to width W2. Naturally, second recess-projection 13 corresponding to width W1 and second recess-projection 13 corresponding to width W2 may be adjacent to each other. In other words, both of first recess-projection 12 and second recess-projection 13 have aperiodic repetition intervals and irregular amplitudes.

Accordingly, a distance from mounting surface 8A of base 8 to a surface of second recess-projection 13 randomly varies along a direction of arrow D. An average value of the amplitude of first recess-projection 12 herein is about 100 times to 1000 times larger than an average value of the amplitude of second recess-projection 13. Similarly, an average value of the repetition interval of first recess-projection 12 is about 100 times to 1000 times larger than an average value of the repetition interval of second recess-projection 13. Therefore, the second amplitude of second recess-projection 13 does not become larger than the first amplitude of first recess-projection 12. Moreover, the second repetition interval of second recess-projection 13 does not become larger than the first repetition interval of first recess-projection 12.

On the other hand, as illustrated in FIG. 5, first recess-projection 12 has a U-shaped or V-shaped sectional shape in the direction in which groove 9 extends. It should be noted that the surface of first recess-projection 12 is also a virtual surface as shown by a dotted line in a cross section perpendicular to the direction in which groove 9 extends. Further, second recess-projection 13 has the second amplitude and the second repetition interval over an entire periphery of the cross section of groove 9. Herein, the amplitude and the repetition interval of second recess-projection 13 do not have fixed values or regularity, and fluctuate randomly.

As described above, groove 9 has a sectional shape formed by synthesizing second recess-projection 13 which is a minute recess-projection and first recess-projection 12 which is a recess-projection larger than second recess-projection 13. In other words, first recess-projection 12 is a bias to second recess-projection 13. Since the depth of groove 9 is not constant along the extending direction of groove 9, the contact area between outer packaging resin 10 and groove 9 becomes large, and the shape of the contact surface between outer packaging resin 10 and groove 9 becomes complicated. This increases an anchor effect between outer packaging resin 10 and groove 9. Therefore, the fixed state between outer packaging resin 10 and base 8 in semiconductor device 6 can be strengthened. As a result, reliability of the sealed state by outer packaging resin 10 of semiconductor device 6 is improved.

Normally, outer packaging resin 10 is constituted of a thermosetting resin material and a filler. Herein, a heat transfer characteristic between outer packaging resin 10 and base 8 particularly depends on a contact area between the filler and base 8. Since second recess-projection 13 is the small recess-projection, the filler hardly infiltrates into second recess-projection 13. On the other hand, since first recess-projection 12 is the large recess-projection, the filler easily infiltrates into first recess-projection 12. In other words, an increase in a surface area of bottom 11 of groove 9 by first recess-projection 12 contributes to an increase in the contact area between the filler and base 8. As a result, the heat transfer characteristic between outer packaging resin 10 and base 8 is improved.

Herein, base 8 may be formed of metal. Therefore, base 8 may be a lead frame or a die pad.

Further, each of the first amplitude, the second amplitude, the first repetition interval, and the second repetition interval does not have the fixed value or regularity at any place of groove 9, and fluctuates randomly. Further, regarding the plurality of grooves 9 disposed around semiconductor element 7, the depth of groove 9 in a single groove 9 is not constant, but the depths of the plurality of grooves 9 are generally approximate to each other. In other words, an average value of the depth of one groove 9 is generally approximate to an average value of the depth of another groove 9. Accordingly, when heat generated by semiconductor element 7 is diffused toward bottom 11 side of groove 9, thermal resistance in bottom 11 of groove 9 is generally constant in any directions from semiconductor element 7. In other words, a deviation hardly occurs in a direction of thermal diffusion. As a result, heat dissipation efficiency in semiconductor device 6 is improved.

Figure 6:
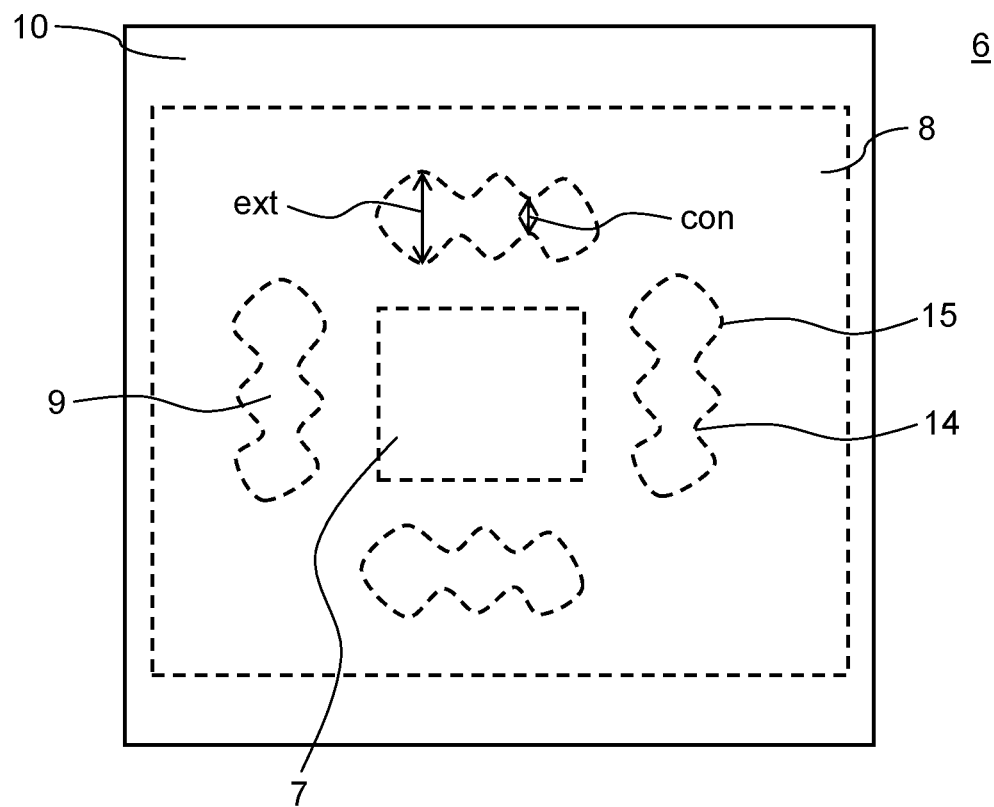
FIG. 6 is a top view illustrating a configuration of the semiconductor device according to the exemplary embodiment of the present invention.

FIG. 6 is a top view illustrating a configuration of semiconductor device 6 according to the exemplary embodiment of the present invention. Herein, an opening shape in a top view of groove 9 on mounting surface 8A of base 8 has constriction part 14 and extension part 15. Constriction part 14 is a part having an opening width narrower than an average opening width of groove 9. Extension part 15 is a part having an opening width wider than an average opening width of groove 9. A minimum opening width of constriction part 14 herein is set at width con. As illustrated in FIG. 4, a depth from mounting surface 8A to bottom 11 becomes minimum in width con. This minimum depth corresponds to a ridge of bottom 11. Further, a maximum opening width of extension part 15 is set at width ext. The depth from mounting surface 8A to bottom 11 becomes maximum in width ext. This maximum depth corresponds to a valley of bottom 11.

As described above, extension part 15 of groove 9 corresponds to a portion in which the depth of groove 9 becomes maximum. Further, constriction part 14 of groove 9 corresponds to a portion in which the depth of groove 9 becomes minimum. In other words, the depth of groove 9 becomes maximum in extension part 15. In short, the depth of groove 9 at extension part 15 is deeper than the depths of groove 9 at two constriction parts 14 adjacent to extension part 15.

With this configuration, groove 9 also has a large recess-projection or a large surface area in an opening direction in addition to the depth direction. Accordingly, the contact area between outer packaging resin 10 and groove 9 is further increased, and the shape of the contact surface between outer packaging resin 10 and groove 9 becomes complicated. This further increases the anchor effect between outer packaging resin 10 and groove 9. Therefore, the fixed state between outer packaging resin 10 and base 8 in semiconductor device 6 can be further strengthened. As a result, reliability of the sealed state by outer packaging resin 10 of semiconductor device 6 is improved.

Figure 7:
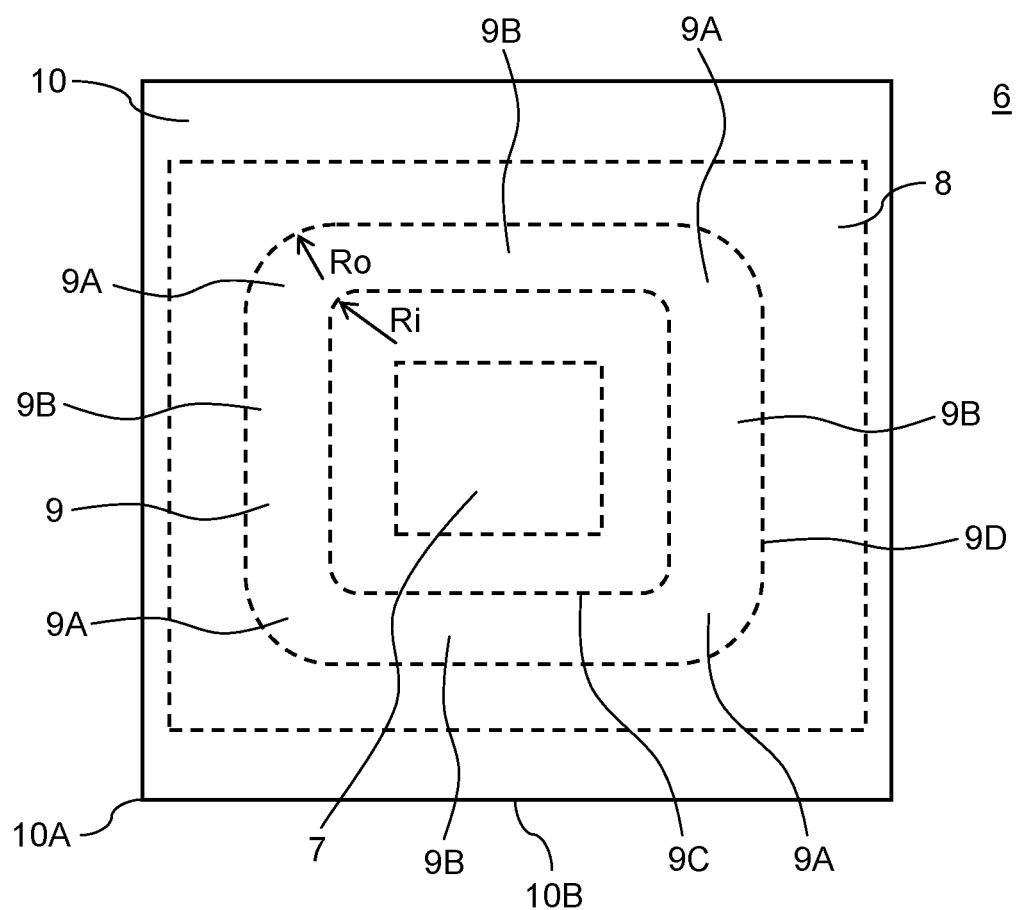
FIG. 7 is a top view illustrating another configuration of the semiconductor device according to the exemplary embodiment of the present invention.

FIG. 7 is a top view illustrating another configuration of the semiconductor device according to the exemplary embodiment of the present invention. Herein, groove 9 provided on base 8 surrounds semiconductor element 7, and has a shape that is generally continuous in a rectangular shape. In other words, groove 9 has four bent parts 9A and four sides 9B. Each bent part 9A is disposed between two sides 9B. In short, a shape in a top view of groove 9 has a continuous rectangular shape surrounding semiconductor element 7. Accordingly, when semiconductor device 6 receives external force, such as impact, from outside, stress applied to groove 9 and outer packaging resin 10, with which groove 9 is filled, is easily dispersed to entire groove 9. As a result, a fixed state between outer packaging resin 10 and base 8 in semiconductor device 6 can be stabilized even when the external force is applied.

Furthermore, in four bent parts 9A of groove 9 formed in the rectangular shape, it is preferable that radius of curvature Ro of an outer periphery of bent part 9A be larger than radius of curvature Ri of an inner periphery of bent part 9A. In a case where semiconductor device 6 receives external force, such as mechanical impact, from outside, the external force is often applied more to outer packaging resin corner 10A or a position of outer packaging resin side 10B closer to outer packaging resin corner 10A than to a center of outer packaging resin side 10B. Accordingly, stress applied to bent part 9A becomes larger than stress applied to side 9B.

Bent part 9A is close to a point of action, such as outer packaging resin corner 10A, and is easy to receive large impact. Herein, since radius of curvature Ro of the outer periphery of bent part 9A is larger than radius of curvature Ri of the inner periphery of bent part 9A, the stress applied to outer packaging resin 10, with which groove 9 is filled, is easily dispersed. As a result, a fixed state between outer packaging resin 10 and base 8 in semiconductor device 6 can be stabilized even when the external force is applied.

Further, since radius of curvature Ri of the inner periphery becomes small, a region, in which semiconductor device 6 is mounted, can be efficiently used. As a result, entire semiconductor device 6 can be miniaturized.

Figure 8:
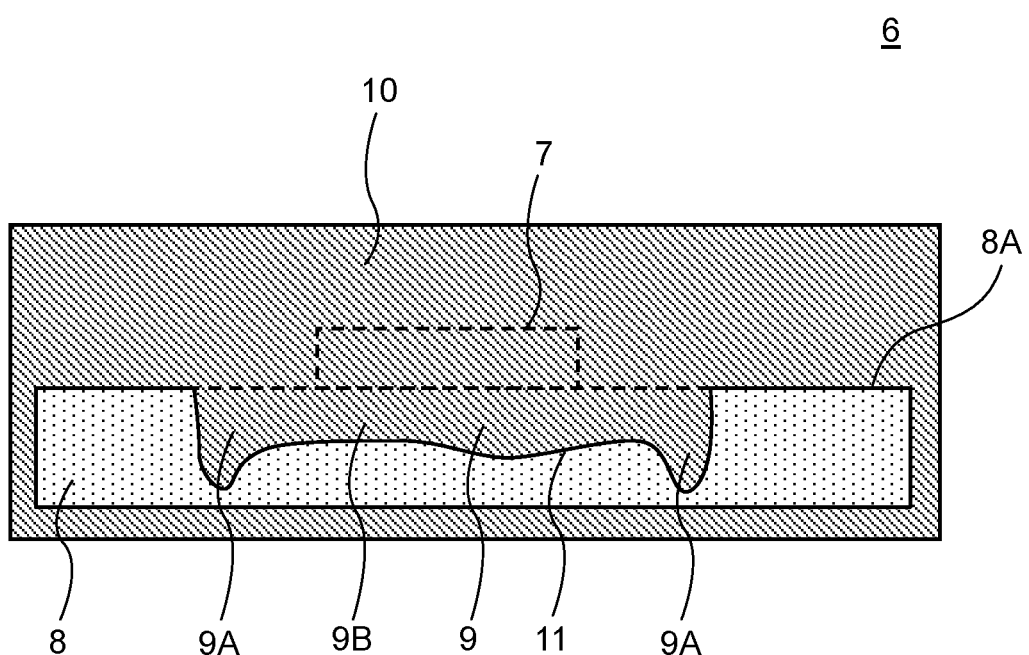
FIG. 8 is a sectional view illustrating another configuration of the semiconductor device according to the exemplary embodiment of the present invention.

FIG. 8 is a sectional view illustrating another configuration of semiconductor device 6 according to the exemplary embodiment of the present invention. Groove 9 herein is formed in a rectangular shape in a top view. A depth of groove 9 from mounting surface 8A to bottom 11 at each bent part 9A is deeper than a depth of groove 9 from mounting surface 8A to bottom 11 at each side 9B.

For example, in a case where groove 9 is formed by laser irradiation, a scanning direction of the laser irradiation is changed at bent part 9A. Accordingly, heat generated by the laser irradiation is more easily accumulated at bent part 9A than at side 9B. Therefore, the depth of groove 9 from mounting surface 8A to bottom 11 at bent part 9A can be easily formed deep.

It should be noted that a method for forming groove 9 is not limited to a forming method by laser irradiation. The method for forming groove 9 may be a forming method by press working or etching processing. In any method, groove 9 can be formed at high productivity.

With this configuration, groove 9 is formed deep at bent part 9A. In a case where semiconductor device 6 receives external force, such as mechanical impact, from the outside of semiconductor device 6, bent part 9A of groove 9 easily receives large stress. Since groove 9 is formed deep at bent part 9A herein, a fixed state between outer packaging resin 10 and base 8 can be further strengthened at bent part 9A. As a result, reliability of a sealed state by outer packaging resin 10 of semiconductor device 6 is improved.

Figure 9:
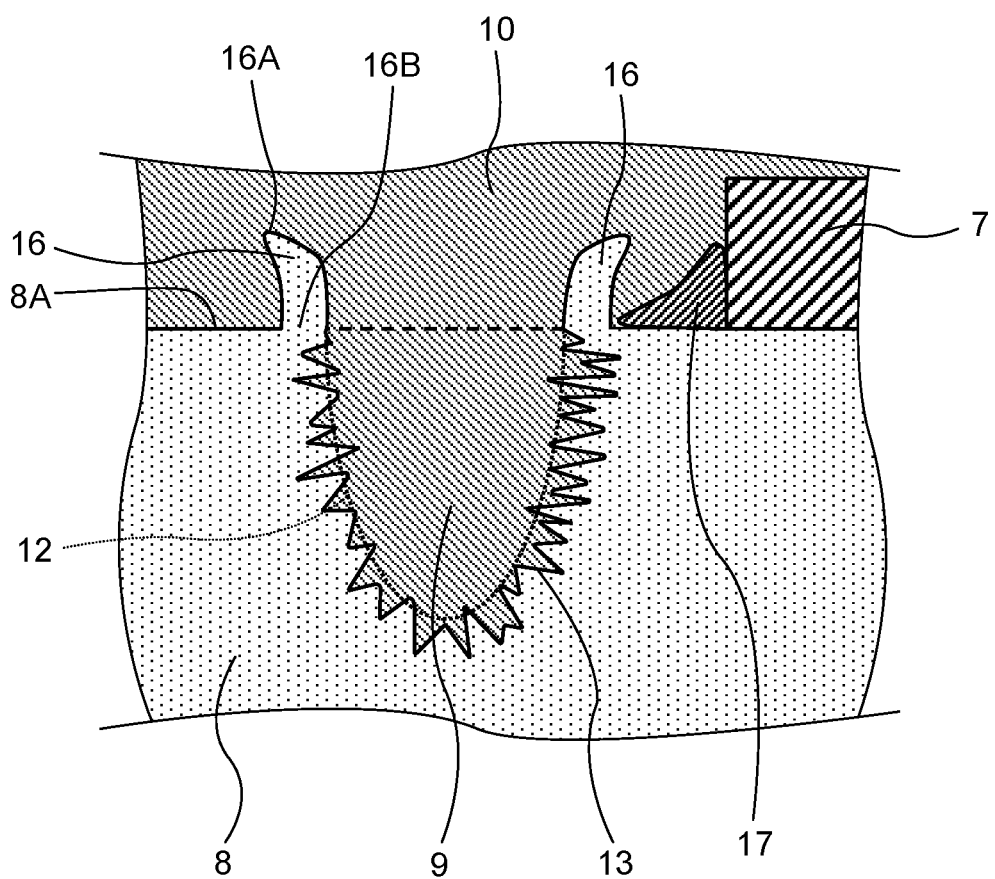
FIG. 9 is a sectional view of a main part illustrating another configuration of the semiconductor device according to the exemplary embodiment of the present invention.

FIG. 9 is a sectional view of a main part illustrating another configuration of semiconductor device 6 according to the exemplary embodiment of the present invention. Herein, base 8 has projection 16 provided at an opening edge of groove 9 on mounting surface 8A. Projection 16 protrudes in a wall shape in a direction opposite to a depressing direction of groove 9. Since projection 16 is provided at the opening edge of groove 9, infiltration of bonding member 17 into groove 9 is suppressed. Bonding member 17 is used when semiconductor element 7 is mounted to mounting surface 8A. Therefore, groove 9 is easily filled with outer packaging resin 10. As a result, a fixed state between outer packaging resin 10 and base 8 in semiconductor device 6 can be stabilized. As a result, reliability of the sealed state by outer packaging resin 10 of semiconductor device 6 is improved.

Further, water or moisture from the outside of semiconductor device 6 easily infiltrates into a boundary surface between mounting surface 8A and outer packaging resin 10. Since projection 16 is provided herein, a distance from an end of base 8 to groove 9 becomes long on the boundary surface between mounting surface 8A and outer packaging resin 10. Accordingly, even in a case where the above-described moisture infiltrates into a part of the boundary surface between mounting surface 8A and outer packaging resin 10, the moisture hardly infiltrates into the entire boundary surface between mounting surface 8A and outer packaging resin 10. From this result, a fixed state between outer packaging resin 10 and base 8 in semiconductor device 6 can be stabilized. As a result, reliability of the sealed state by outer packaging resin 10 of semiconductor device 6 is improved.

Projection 16 may be disposed along the entire opening edge of groove 9. Projection 16 may be disposed in a closed solid annular shape along inner peripheral edge 9C or outer peripheral edge 9D illustrated in FIG. 7. Alternatively, projection 16 may be disposed in a closed dashed annular shape along inner peripheral edge 9C or outer peripheral edge 9D.

For example, when base 8 is heated at high temperature and groove 9 is formed by laser irradiation, projection 16 herein may be formed by accumulating a molten material of base 8 at the opening edge of groove 9. With this configuration, as illustrated in FIG. 9, tip 16A of projection 16 is easily disposed more outside than joint 16B with respect to groove 9. In other words, projection 16 may be inclined to the outside with respect to groove 9. With this configuration, a part of outer packaging resin 10 can be engaged with projection 16 having a hooked sectional shape. As a result, the fixed state between outer packaging resin 10 and base 8 can be strengthened. Accordingly, reliability of the sealed state by outer packaging resin 10 of semiconductor device 6 is improved.

Further, when groove 9 and projection 16 are formed by laser machining, surfaces of groove 9 and projection 16 are oxidized. Accordingly, an oxide film (not illustrated) is formed on the surfaces of groove 9 and projection 16. This deteriorates wettability of groove 9 and projection 16 with respect to bonding member 17. In other words, groove 9 and projection 16 can suppress a flow of bonding member 17. Bonding member 17 herein is solder, for example. Alternatively, adhesion of groove 9 and projection 16 to outer packaging resin 10 can be improved by removing the oxide film on the surfaces of groove 9 and projection 16.

Figure 10:
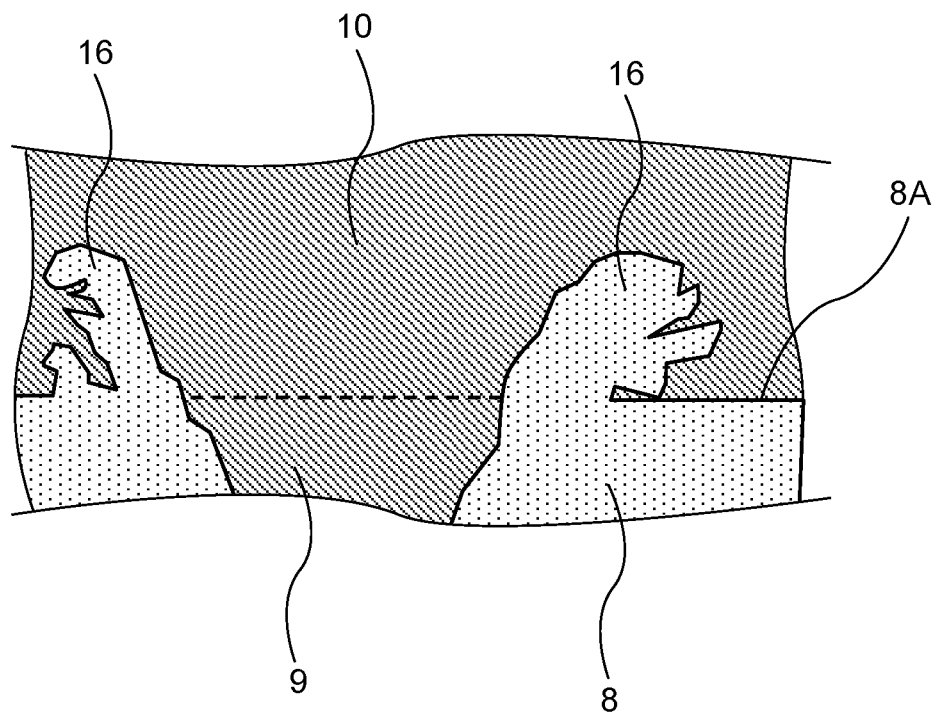
FIG. 10 is an enlarged sectional view of a main part illustrating another configuration of the semiconductor device according to the exemplary embodiment of the present invention.
Figure 11:
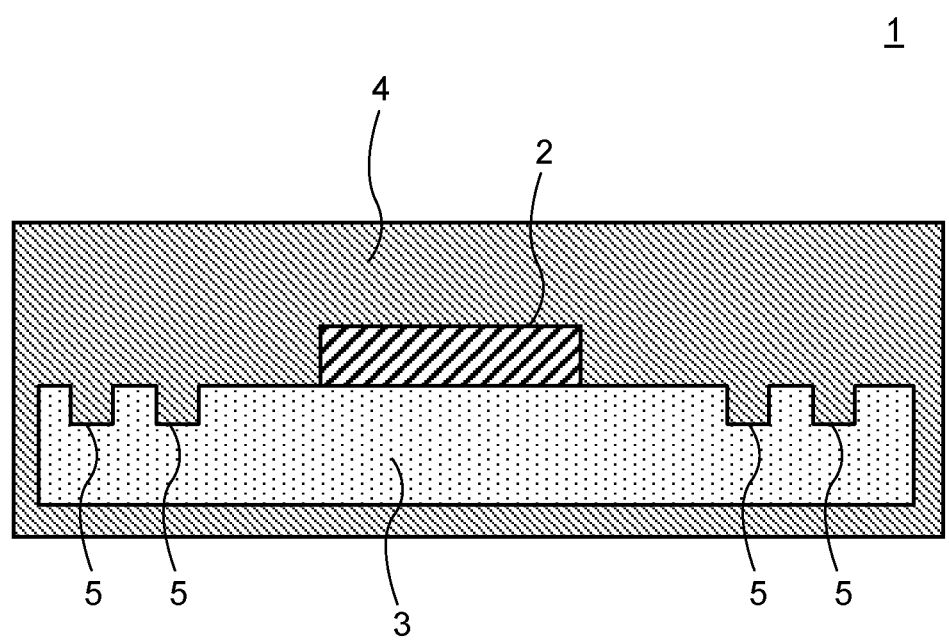
FIG. 11 is a sectional view illustrating a configuration of a conventional semiconductor device.

FIG. 10 is an enlarged sectional view of a main part illustrating another configuration of semiconductor device 6 according to the exemplary embodiment of the present invention. Herein, a wall surface of projection 16 that does not face groove 9 has a plurality of recesses and projections. With this configuration, a fixed state between outer packaging resin 10 and base 8 can be strengthened, as described above. Moreover, a distance from an end of base 8 to groove 9 becomes longer on a boundary surface between mounting surface 8A and outer packaging resin 10. As a result, even in a case where moisture infiltrates into a part of the boundary surface between mounting surface 8A and outer packaging resin 10, it is more difficult for the moisture to infiltrate into the entire boundary surface between mounting surface 8A and outer packaging resin 10. Accordingly, reliability of a sealed state by outer packaging resin 10 of semiconductor device 6 is further improved.

INDUSTRIAL APPLICABILITY

A semiconductor device of the present invention has an effect of improving reliability of a sealed state by an outer packaging resin, and is useful for various electronic devices.

REFERENCE MARKS IN THE DRAWINGS 6 semiconductor device
7 semiconductor element
8 base
8A mounting surface
9 groove
9A bent part
9B side
9C inner peripheral edge
9D outer peripheral edge
10 outer packaging resin
10A outer packaging resin corner
10B outer packaging resin side
11 bottom
12 first recess-projection
13 second recess-projection
14 constriction part
15 extension part
16 projection
16A tip
16B joint
17 bonding member

The invention claimed is:

1. A semiconductor device comprising:
a semiconductor element;
a base having a mounting surface, on which the semiconductor element is mounted, and a groove provided around the semiconductor element on the mounting surface; and
an outer packaging resin that covers the semiconductor element and the base, the outer packaging resin being fixed to the base by filling the groove,
wherein a bottom of the groove includes a first recess-projection having a first amplitude and a first repetition interval along an extending direction of the groove, and
the first recess-projection includes a second recess-projection having a second amplitude smaller than the first amplitude and a second repetition interval shorter than the first repetition interval along the extending direction of the groove.

2. The semiconductor device according to claim 1, wherein the first amplitude, the first repetition interval, the second amplitude, and the second repetition interval each fluctuate randomly.

3. The semiconductor device according to claim 1, wherein
an opening shape in a top view of the groove has an extension part, and
a depth of the groove becomes maximum at the extension part.

4. The semiconductor device according to claim 1, wherein a shape in a top view of the groove has a continuous rectangular shape surrounding the semiconductor element.

5. The semiconductor device according to claim 1, wherein
the groove has two sides and a bent part disposed between the two sides, and
a radius of curvature of an outer periphery of the bent part is larger than a radius of curvature of an inner periphery of the bent part.

6. The semiconductor device according to claim 5, wherein a depth of the groove at the bent part is deeper than depths of the groove at the two sides.

7. The semiconductor device according to claim 1, wherein the base has a projection provided at an opening edge of the groove on the mounting surface.

* * * * *